United States Patent [19]

Hébert

[11] Patent Number: 5,742,091

[45] Date of Patent: Apr. 21, 1998

[54] SEMICONDUCTOR DEVICE HAVING A PASSIVE DEVICE FORMED OVER ONE OR MORE DEEP TRENCHES

[75] Inventor: Francois Hébert, Sunnyvale, Calif.

[73] Assignee: National Semiconductor Corporation, Santa Clara, Calif.

[21] Appl. No.: 788,361

[22] Filed: Jan. 24, 1997

Related U.S. Application Data

[63] Continuation of Ser. No. 501,233, Jul. 12, 1995, abandoned.

[51] Int. Cl.$^6$ .............................. H01L 29/76; H01L 29/00
[52] U.S. Cl. ................. 257/531; 257/374; 257/396; 438/164; 438/221; 438/225; 438/359; 438/424; 438/435
[58] Field of Search ....................... 257/531, 532, 257/374, 386, 395, 396; 438/164, 221, 225, 359, 424, 435

[56] References Cited

U.S. PATENT DOCUMENTS

| | | | |
|---|---|---|---|
| 5,010,378 | 4/1991 | Douglas | 257/301 |
| 5,095,357 | 3/1992 | Andoh et al. | 357/51 |
| 5,370,766 | 12/1994 | Desaigoudar et al. | 156/643 |
| 5,384,274 | 1/1995 | Kanechachi | 251/276 |

OTHER PUBLICATIONS

Introduction to Electric Circuits, Fifth Edition Herbert W. Jackson, 1981.

Chang et al., "Large Suspended Inductors on Silicon and Their Use in a 2–μm CMOS Amplifier" (IEEE Electronic Device Letters, vol. 14, No. 5, May 1993) pp. 246–248.

S. Wolf, Silicon Processing for the VLSI Era (vol. 2), (Lattice Press, 1990), pp. 51–58.

Primary Examiner—Tom Thomas
Assistant Examiner—Fetsum Abraham
Attorney, Agent, or Firm—Limbach & Limbach L.L.P.

[57] ABSTRACT

A semiconductor device includes at least one passive device and is configured such that parasitic capacitances associated with the passive device are minimized. A substrate layer of the semiconductor device is formed of a substrate material characterized by a first dielectric constant. The substrate layer has at least one deep trench formed therein, and the deep trench is filled with a trench fill material characterized by a second, effective, dielectric constant that is lower than the first dielectric constant. A field layer is formed on a surface of the substrate layer over the deep trench. Finally, the passive device is formed on a surface of the field layer.

26 Claims, 6 Drawing Sheets

5,742,091

SEMICONDUCTOR DEVICE HAVING A PASSIVE DEVICE FORMED OVER ONE OR MORE DEEP TRENCHES

This is a continuation of application Ser. No. 08/501,233 filed on Jul. 12, 1995 now abandoned.

TECHNICAL FIELD OF THE INVENTION

The present invention relates to semiconductor devices, and in particular, to a semiconductor device that includes at least one passive device formed over one or more deep trenches such that parasitic capacitances associated with the passive device are lowered.

BACKGROUND OF THE INVENTION

Inductors encased in oxide over a silicon substrate are well-known in the art. However, these well-known inductors perform poorly in the high-frequency environments required by today's technology (e.g., wireless communication technology). In particular, self-resonance caused by parasitic capacitance (e.g., of the inductor to the silicon substrate) causes this poor performance.

A semiconductor device 100 is shown in plan view in FIG. 1. Referring to FIG. 1, an inductive metal coil 102 of the semiconductor device 100 is connected to a contact 106 by a cross-under 104.

FIG. 2 schematically illustrates a conventional semiconductor device 200 in cross-section (e.g., along the line II(V)—II(V) of FIG. 1). As shown in FIG. 2, the inductive metal coil 102 is formed on a surface of a field oxide layer 108, which is formed on a surface of a silicon substrate layer 110. The parasitic capacitances present within the conventional semiconductor device 200 are indicated schematically in FIG. 2 as Cis, Ccco, and Cccs. Capacitance Cis is the parasitic inductor-to-substrate capacitance, which is a function of thickness of the field oxide layer 108. Ccco is the inductor coil-to-coil parasitic capacitance through the field oxide 108, and Cccs is the inductor coil-to-coil parasitic capacitance through the substrate layer 110.

Referring next to FIG. 3, a prior art semiconductor device 300 disclosed by Chang et al., in "Large Suspended Inductors on Silicon and Their Use in a 2-µm CMOS RF Amplifier" (IEEE Electronic Device Letters, Vol. 14, No. 5, May 1993) is schematically illustrated therein. Chang et al. attempted to improve inductor performance by selectively etching a void 312 underneath the inductor coils 102, such that the inductor coils 102 are encased in a suspended oxide layer attached at four corners to the rest of the integrated circuit. Chang et al. disclose that they have experimentally determined that inductors suspended in this way perform better at high frequencies than conventionally-packaged inductors.

However, a problem with Chang et al.'s suspended inductor is that, particularly if the packaging material is plastic, the large void 312 in the circuit die will be filled by the packaging material. In addition, if wet etching is used to create the void 312, then the void sidewalls 313 will have a relatively shallow slope, and the resultant void will be large relative to the inductive metal coil 102. As a result, it is not possible to form active devices close to the inductor. Furthermore, not only are additional processing steps required to form the etched-out void 313, but the void 313 necessarily prevents the inductive metal coil 102 from being formed over an active device.

Referring to FIG. 4, one way to improve the Chang et al. inductor 300 would be to fill in the etched-out void 312 (shown as 312' in FIG. 4) with a low-dielectric "tub-fill" material. However, while this solves the problem of the void being filled by packaging material, the large surface area of the void 312' dictates that extra processing steps are required to planarize the tub fill material.

SUMMARY OF THE INVENTION

The present invention is a semiconductor device that includes at least one passive device (e.g., bond pads or an inductor) and is configured such that parasitic capacitances associated with the passive device are minimized. A substrate layer of the semiconductor device is formed of a substrate material characterized by a first dielectric constant. The substrate layer has at least one deep trench formed therein, and the deep trench is filled with a trench fill material characterized by a second, effective, dielectric constant that is lower than the first dielectric constant. A field material layer is formed on a surface of the substrate layer over the deep trench. Finally, the at least one passive device is formed on a surface of the field material layer.

A better understanding of the features and advantages of the invention will be obtained by reference to the following derailed description and accompanying drawings which set forth an illustrative embodiment in which the principles of the invention are utilized.

DETAILED DESCRIPTION

Figure 1:
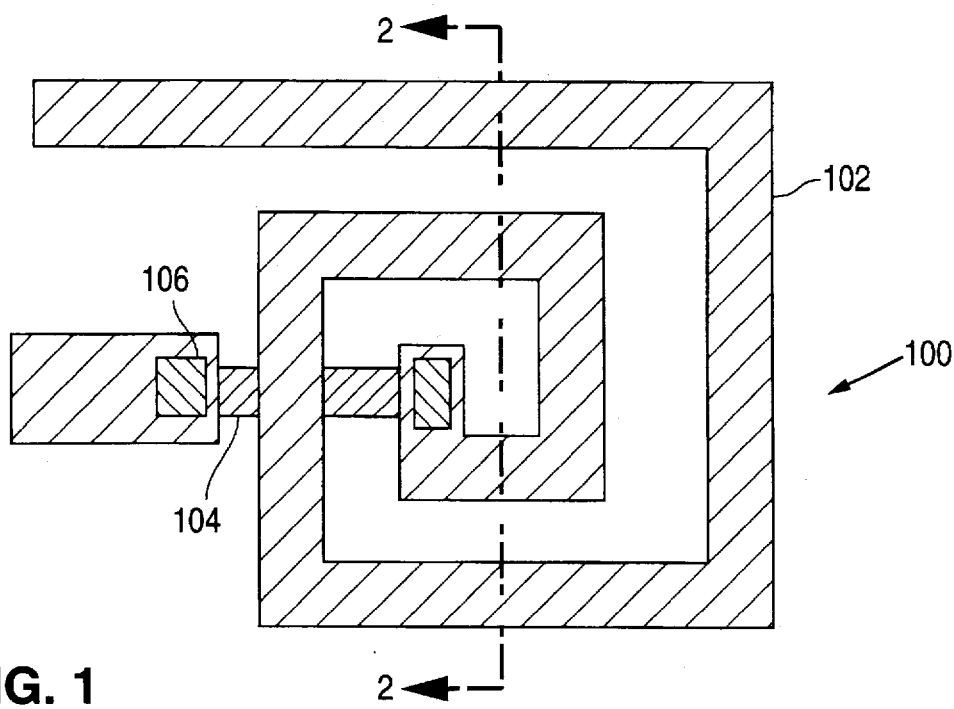
FIG. 1 schematically illustrates, in plan view, a semiconductor device that includes an inductor coil.
Figure 2:
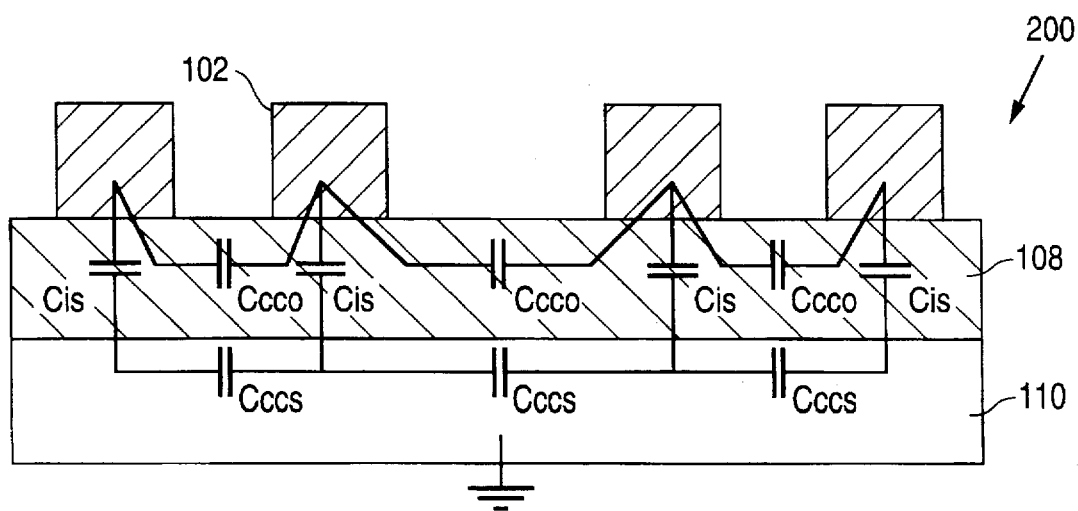
FIG. 2 schematically illustrates a prior art semiconductor device (in cross-section along the line II(V)–II(V) of FIG. 1).
Figure 3:
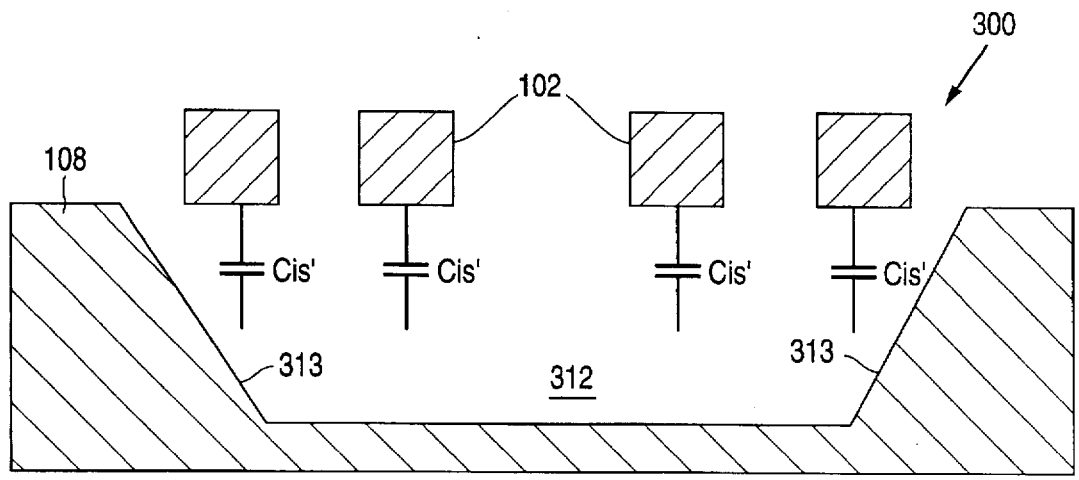
FIG. 3 schematically illustrates (in cross-section) a prior art semiconductor device in which a void has been selectively etched beneath the inductor coils such that the inductor coils are encased in a suspended oxide layer.
Figure 4:
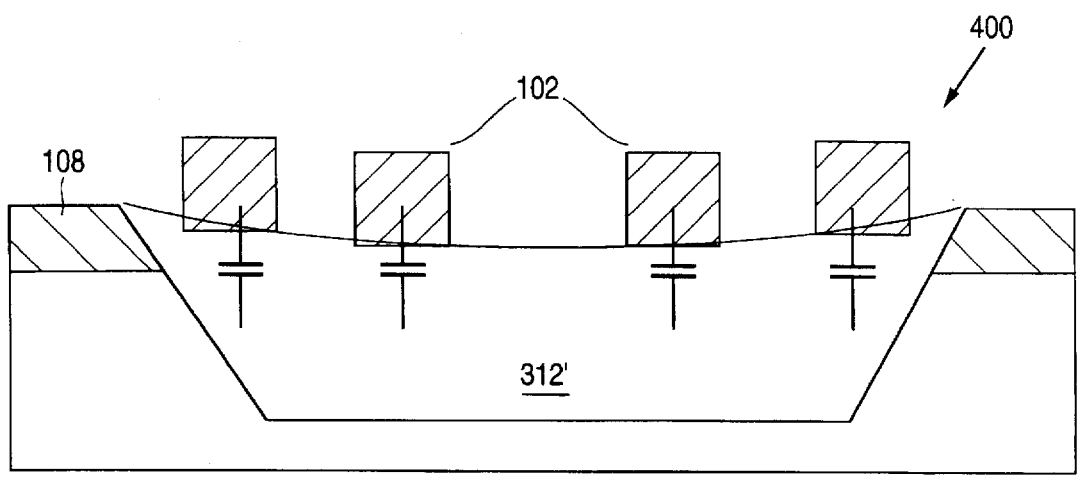
FIG. 4 schematically illustrates (in cross-section) a proposed improvement over the prior art device of FIG. 3, the improvement being that the void is filled with a low-dielectric tub material.
Figure 5:
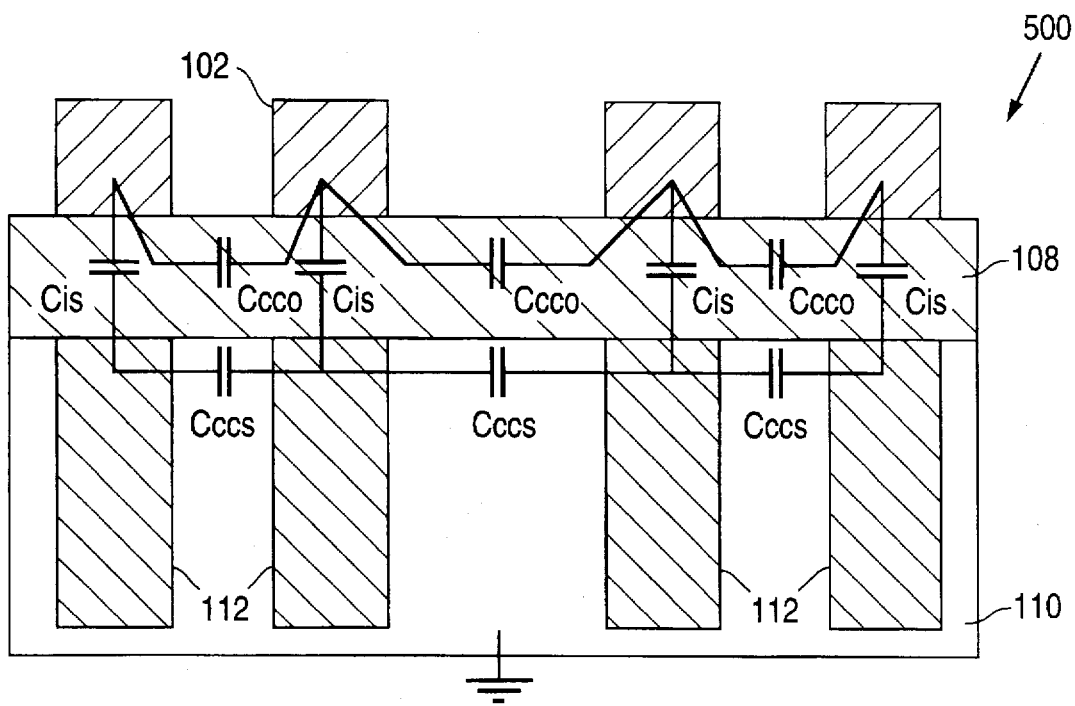
FIG. 5 schematically illustrates (in cross-section along the line II(V)—II(V) of FIG. 1) a semiconductor device, in accordance with the present invention, that includes a metal coil inductor formed directly over a deep trench.

FIG. 5 schematically illustrates a semiconductor device 500 in accordance with an embodiment of the present invention. The semiconductor device 500 is shown in cross-section (i.e., along the line II(V)—II(V) of FIG. 1). Semiconductor device 500 is similar to conventional semiconductor device 200, except that it also includes one significant additional feature. In particular, a deep trench 112 is formed in the silicon substrate layer 110, directly beneath the inductor coil 102. The deep trench 112 is filled with a trench-fill material that has an effective dielectric constant lower than the dielectric constant of the substrate layer 110.

The deep trench 112 has the effect of both minimizing Cis (the parasitic inductor-to-substrate capacitance) and of reducing Cccs (the parasitic coil-to-coil capacitance through the substrate). However, unlike the filled-in void 312' of prior art semiconductor device 400, the deep trench 112 has a much smaller surface area. Thus, the trench-fill material is readily planarized (e.g., by trench fill and etchback, or by polishing). In addition, if trench isolation is already used isolate active devices, then no additional processing steps are needed to manufacture the semiconductor device 500. The deep trench 112 may be fabricated by any of a number of well-known methods. For example, trench manufacture for isolation of active devices is described on pp. 51–58 of *Silicon Processing for the VLSI Era* (Vol. 2), by S. Wolf (Lattice Press, 1990).

Figure 6:
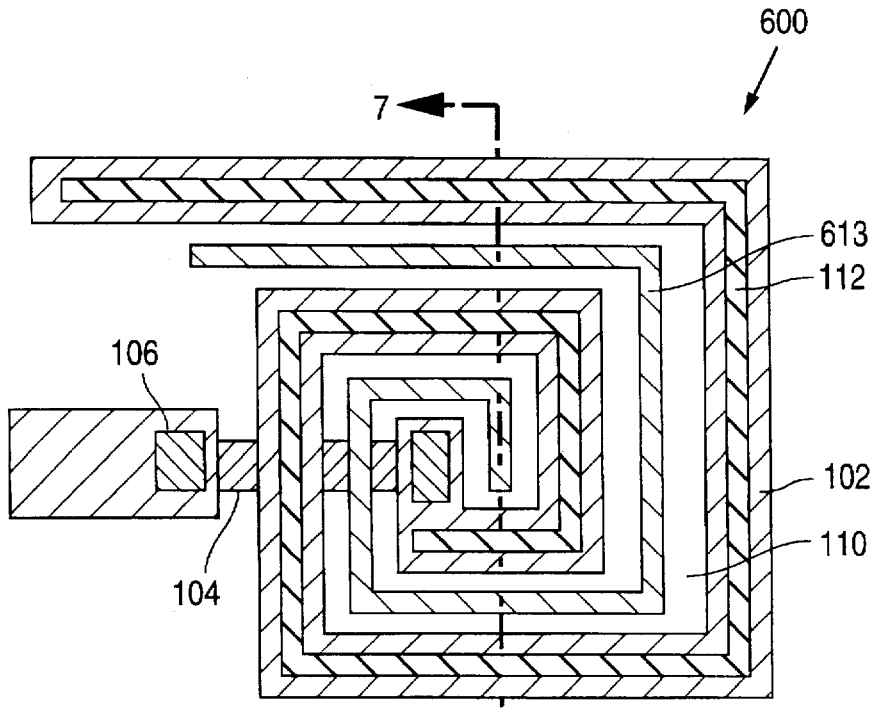
FIG. 6 (plan view) and FIG. 7 (cross-sectional view across line VII—VII of FIG. 6.) schematically illustrates a semiconductor device like the device illustrated in FIG. 5, but that also includes a deep trench formed below the metal coil inductor and between the lines of the inductor.
Figure 7:
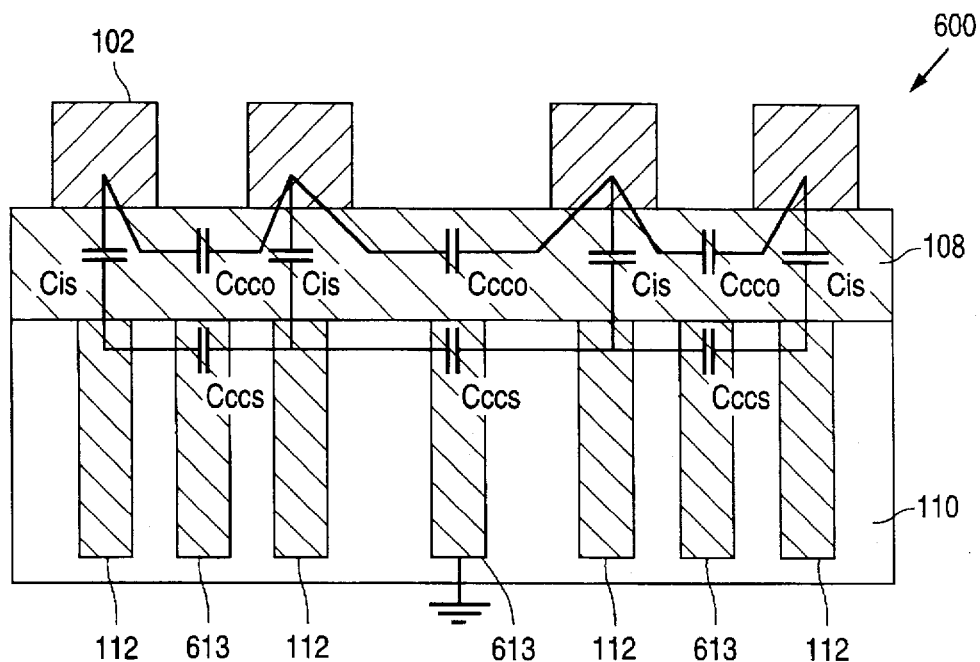

FIG. 6 (plan view) and FIG. 7 (cross-sectional view across line VII—VII in FIG. 6) schematically illustrate a semiconductor device 600 in accordance with a further embodiment of the present invention. Like semiconductor device 500 (FIG. 5), semiconductor device 600 includes a deep trench 112 formed in the silicon substrate layer 110, directly beneath the inductor coil 102. In addition to the deep trench 112, semiconductor device 600 also includes a second deep trench 613 formed in the silicon substrate layer 110, between the inductor coil 102. Thus, not only is the Cis minimized by the first deep trench 112, but also the second deep trench 613 effectively short circuits the Cccs's.

Figure 8:
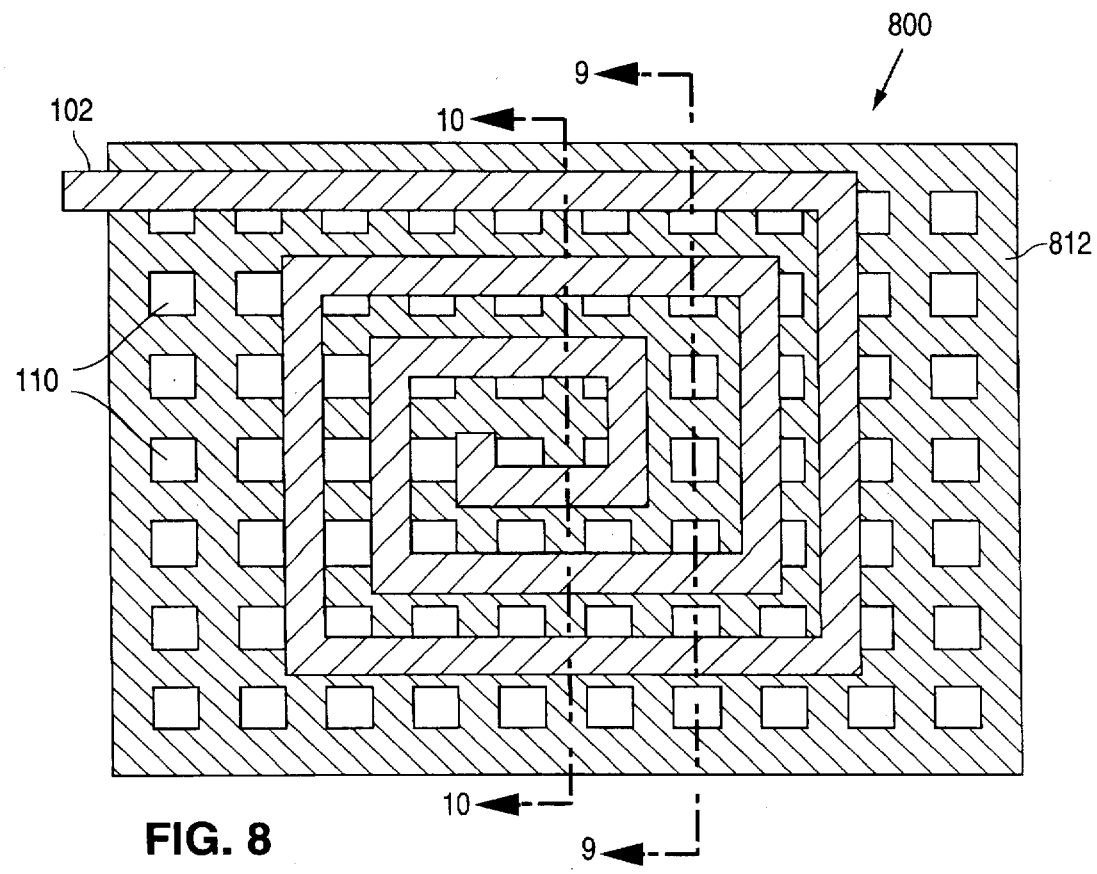
FIG. 8 (plan view) and FIGS. 9–13 (cross-sectional view across lines IX—IX and X—X, respectively) schematically illustrate a semiconductor device, in accordance with the present invention, that includes a deep trench that defines a grid pattern beneath a metal coil inductor.
Figure 9:
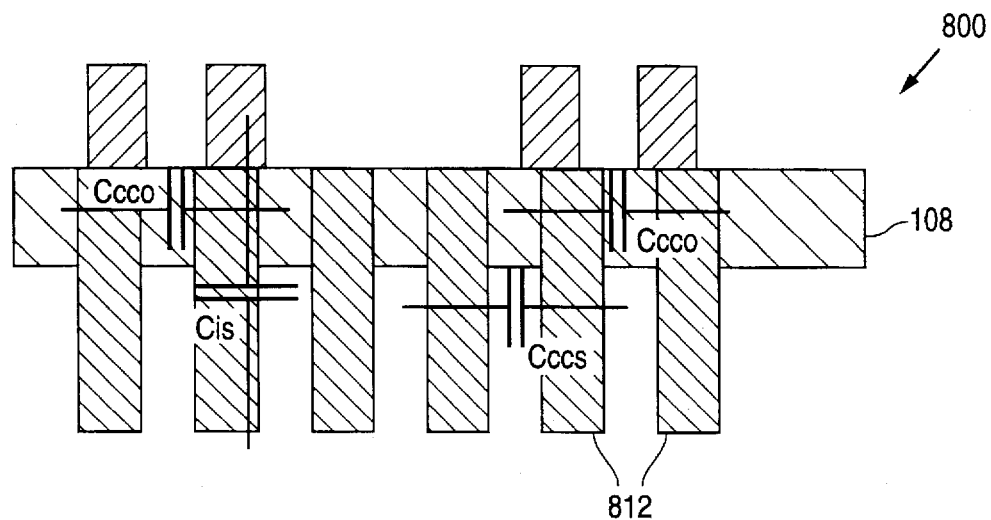
Figure 10:
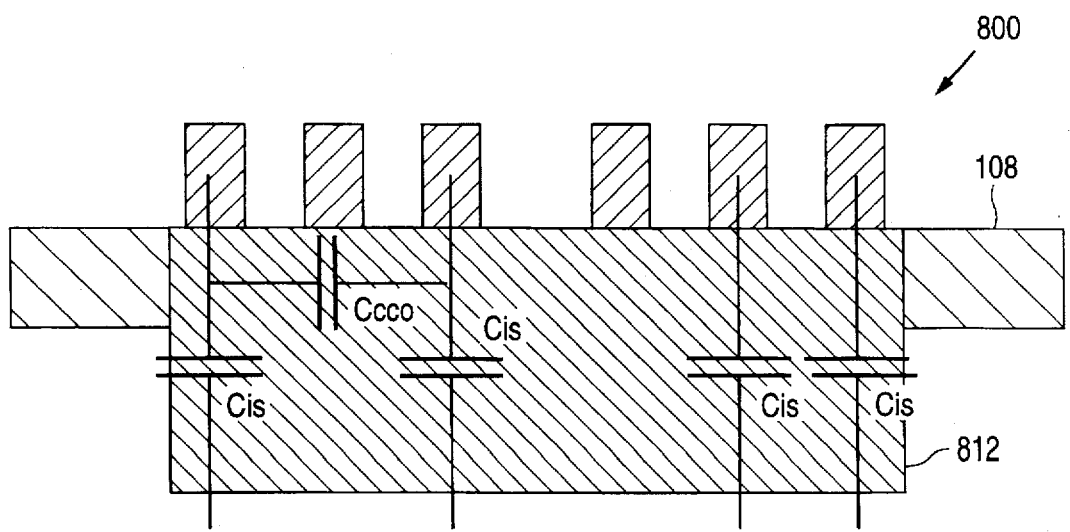

FIG. 8 (plan view) and FIGS. 9 and 10 (cross-sectional view across lines IX—IX and X—X, respectively) schematically illustrate a semiconductor device 800 in accordance with a still further embodiment of the present invention. A deep trench 812 of semiconductor device 800 defines a grid pattern in the silicon substrate layer 110. The grid layout of the deep trench 812 makes it easy to manufacture. In addition, as can be seen from FIGS. 9 and 10, the deep trench 812 minimizes Cis, Cccs, and Ccco. Furthermore, the deep trench 818 is easily planarized while, assuming that the trench pitch is anywhere from one fifth to one half of the metal pitch, approximately 75% of the inductive metal coil 102 is directly over the deep trench 818.

Using the 75% figure, the capacitance to the substrate (Cis) can be estimated to be:

$$\left[ (.25)(\text{metal area}) \times \left( \frac{\text{field oxide capac.}}{\text{unit area}} \right) \right] +$$
$$\left[ (.75)(\text{metal area}) \times \left( \frac{\text{trench capac.}}{\text{unit area}} \right) \right]$$

where $$\frac{\text{field oxide capac.}}{\text{unit area}} \rightarrow \frac{\epsilon_{oxide} \epsilon_{vacuum}}{\text{oxide thickness}}$$

which, for a typical process with a 1 micron thick field oxide and a 10 micron deep trench filled with oxide, $$\approx \frac{(8.85 \times 10^{-14})(3.9 \times 10^{-8})}{1.0 \times 10^{-4}} \frac{F}{\mu m^2} = 3.46 \times 10^{-17} \frac{F}{\mu m^2}$$

and where $$\frac{\text{trench capac.}}{\text{unit area}} \rightarrow \frac{\epsilon_{trackfill} \cdot \epsilon_{vacuum}}{\text{trench depth}}$$

which $$\approx \frac{(8.85 \times 10^{-14})(3.9 \times 10^{-8})}{10 \times 10^{-4}} = 3.46 \times 10^{-18} \frac{F}{\mu m^2}$$

$$\therefore \approx 3 \times \text{reduction in } Cis.$$

Figure 11:
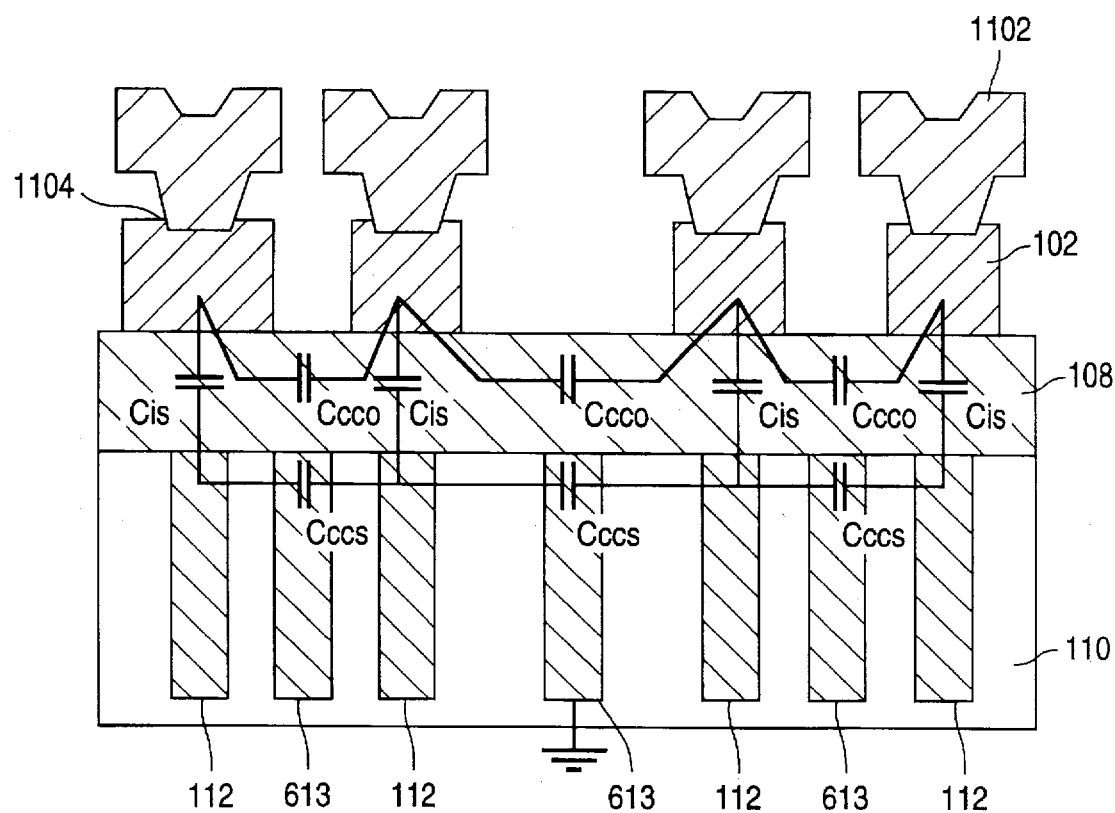

In accordance with a further embodiment of the present invention illustrated in FIG. 11, a second metal coil 1102 is formed above the metal coil 102 and is connected to the metal coil 102 by a via contact 1104. The combination of the metal coil 102 and the second metal coil 1102 has a lower series resistance than the resistance of the metal coil 102 alone, thus providing an inductor with a higher "Q factor". It is well-known the high-Q inductors have great sharpness of resonance that makes them useful for many electronic applications.

Figure 12:
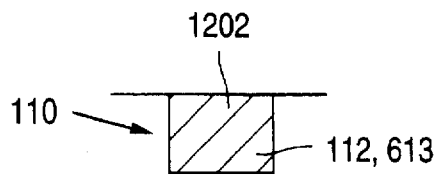
Figure 13:
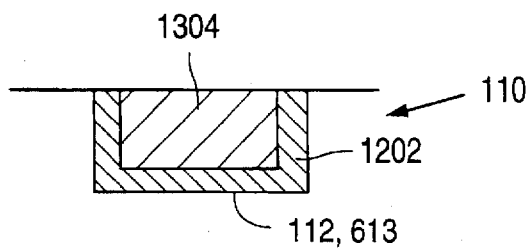

The trench fill material is now described with reference to FIGS. 12 and 13. As discussed above, it is a significant feature of the invention that the trench fill material has an effective dielectric constant that is less than the dielectric constant of the surrounding substrate layer 110. This is how the parasitic capacitances are reduced. One way this can be achieved is by filling the deep trench 110 with an oxide 1202, as shown in FIG. 12. Another way this can be achieved is by first lining the deep trench 110 with an oxide, and then filling the lined trench with any other material (denoted as 1304 in FIG. 13), even a conductive material such as poly-silicon. Other materials that may be used for the other material 1304 are polymide, photoresist, spin on glass (SOG), and silicon nitride. The dielectric constant that characterizes the other material 1304 is irrelevant, since the oxide liner 1202 isolates the other material 1304 from the surrounding silicon of the substrate layer.

It may be appreciated that, in all of the described embodiments, the presence of the trench tends to increase the impedance, in series, between the parasitic capacitances and the substrate 110.

It should be understood that various alternatives to the embodiments of the invention described herein may be employed in practicing the invention. For example, it is within the scope of the invention to utilize deep trenches for reducing the parasitic capacitances associated with other passive devices such as bond pads. It is intended that the following claims define the scope of the invention and that methods and apparatus within the scope of these claims and their equivalents be covered thereby.

What is claimed is:

1. A semiconductor device within which parasitic capacitances are minimized, the semiconductor device comprising: a substrate layer formed of a substrate material characterized by a first dielectric constant, said substrate layer including a trench portion, characterized by a trench pitch, said trench portion of said substrate layer having at least one trench formed therein and said trench portion of said substrate layer also including substrate material, said at least one trench formed in said trench portion of said substrate layer being filled with a trench fill material characterized by a second, effective, dielectric constant lower than said first dielectric constant, wherein the trench portion of said substrate layer has a surface, the surface of the trench portion including a plurality of first portions, formed of trench fill material, and a plurality of second portions, formed of substrate material;

a field layer formed on a surface of the substrate layer, including over said first portions of said surface of said trench portion of said substrate layer, formed of trench fill material, and over said second portions of said surface of said trench portion of said substrate layer, formed of substrate material; and a passive device, characterized by a device pitch, formed on a surface of said field layer over said trench portion of said substrate layer, wherein said trench pitch is less than ½ of said device pitch.

2. A semiconductor device as in claim 1, wherein said passive device includes at least one bond pad.

3. A semiconductor device as in claim 1, wherein said trench fill material forms a substantially planar trench fill surface.

4. A semiconductor device within which parasitic capacitances are minimized, the semiconductor device comprising:

a substrate layer formed of a substrate material characterized by a first dielectric constant, said substrate layer including a trench portion, said trench portion of said substrate layer having at least one trench formed therein and said trench portion of said substrate layer also including substrate material, said at least one trench formed in said trench portion of said substrate layer being filled with a trench fill material characterized by a second, effective, dielectric constant lower than said first dielectric constant;

a field layer formed on a surface of the substrate layer over said trench portion of said substrate layer; and a passive device formed on a surface of said field layer over said trench portion of said substrate layer wherein said passive device defines a first pattern and said at least one trench formed in said trench portion of said substrate layer includes a first trench that defines a second pattern, and wherein said first pattern is at least partially coincidental with said second pattern.

5. A semiconductor device as in claim 4, wherein said first pattern is substantially coincidental with said second pattern.

6. A semiconductor device as in claim 5, wherein said passive device is an inductor coil formed of a conductive material.

7. A semiconductor device as in claim 6, wherein said passive device is an inductor coil formed of a plurality of stacked inductor coil elements, each of said plurality of stacked inductor coil elements being conductively connected to at least one other of said inductor coil elements by a via.

8. A semiconductor device as in claim 5, wherein said at least one trench formed in said trench portion of said substrate layer further includes a second trench that defines a third pattern, and wherein said third pattern is substantially uncoincidental with said second pattern.

9. A semiconductor device as in claim 8, wherein said passive device is an inductor coil formed of a conductive material.

10. A semiconductor device as in claim 5, wherein said passive device is an inductor coil formed of a plurality of stacked inductor coil elements, each of said plurality of stacked inductor coil elements being conductively connected to at least one other of said inductor coil elements by a via.

11. A semiconductor device as in claim 5, wherein said trench fill material includes an insulating material linings said at least one trench.

12. A semiconductor device as in claim 11, wherein said trench fill material further includes a conducting material that is insulated from said substrate material of said substrate layer by said insulating material lining.

13. A semiconductor device within which parasitic capacitances are minimized, the semiconductor device comprising:

a substrate layer formed of a substrate material characterized by a first dielectric constant, said substrate layer including a trench portion, said trench portion of said substrate layer having at least one trench formed therein and said trench portion of said substrate layer also including substrate material, said at least one trench formed in said trench portion of said substrate layer being filled with a trench fill material characterized by a second, effective, dielectric constant lower than said first dielectric constant;

a field layer formed on a surface of the substrate layer over said trench portion of said substrate layer; and a passive device formed on a surface of said field layer over said trench portion of said substrate layer wherein said at least one trench formed in said trench portion of said substrate layer includes a plurality of trenches that collectively define a grid pattern.

14. A method of fabricating a semiconductor device within which parasitic capacitances are minimized, the method comprising:

forming a substrate layer of a substrate material characterized by a first resistivity;

forming at least one deep trench in a trench portion of said substrate layer such that said trench portion of said substrate layer also includes substrate material and said trench portion characterized by a trench pitch, and filling said at least one trench of said trench portion of said substrate layer with a trench fill material characterized by a second, effective, resistivity lower than said first resistivity, such that the trench portion of said substrate layer has a surface, the surface of the trench portion including a plurality of first portions, formed of trench fill material, and a plurality of second portions, formed of substrate material;

forming a field layer on a surface of the substrate layer over said trench portion of said substrate layer, including over said first portions of said surface of said trench portion of said substrate layer, formed of trench fill material, and over said second portions of said surface of said trench portion of said substrate layer, formed of substrate material; and forming a passive device, characterized by a device pitch, on a surface of said field layer over said trench portion of said substrate layer having said at least one trench formed therein, wherein said trench pitch is less than ½ of said device pitch.

15. A semiconductor device fabrication method as in claim 14, wherein said step of forming said passive device includes forming at least one bond pad.

16. A semiconductor device fabrication method as in claim 14, wherein said trench fill material forms a substantially planar trench fill surface.

17. A method of fabricating a semiconductor device within which parasitic capacitances are minimized, the method comprising:

forming a substrate layer of a substrate material characterized by a first resistivity;

forming at least one deep trench in a trench portion of said substrate layer such that said trench portion of said substrate layer also includes substrate material, and filling said at least one trench of said trench portion of said substrate layer with a trench fill material characterized by a second, effective, resistivity lower than said first resistivity;

forming a field layer on a surface of the substrate layer over said trench portion of said substrate layer; and forming a passive device on a surface of said field layer over said trench portion of said substrate layer having said at least one trench formed therein, wherein said passive device defines a first pattern and said at least one trench formed in said trench portion of said substrate layer includes a first trench that defines a second pattern, and wherein said first pattern is at least partially coincidental with said second pattern.

18. A semiconductor device fabrication method as in claim 17, wherein said first pattern is substantially coincidental with said second pattern.

19. A semiconductor device fabrication method as in claim 18, wherein said step of forming said passive device includes forming an inductor coil of a conductive material.

20. A semiconductor device fabrication method as in claim 19, wherein said step of forming said passive device includes forming an inductor coil of a plurality of stacked inductor coil elements, each of said plurality of stacked inductor coil elements being conductively connected to at least one other of said inductor coil elements by a via.

21. A semiconductor device fabrication method as in claim 18, wherein said step of forming at least one trench in said trench portion of said substrate layer further includes a step of forming a second trench that defines a third pattern, wherein said third pattern is substantially uncoincidental with said second pattern.

22. A semiconductor device fabrication method as in claim 21, wherein said step of forming said passive device includes forming an inductor coil of a conductive material.

23. A semiconductor device fabrication method as in claim 18, wherein said step of forming said passive device includes forming an inductor coil of a plurality of stacked inductor coil elements, each of said plurality of stacked inductor coil elements being conductively connected to at least one other of said inductor coil elements by a via.

24. A semiconductor device fabrication method as in claim 18, wherein said trench fill material includes an insulating material lining said at least one trench.

25. A semiconductor device fabrication method as in claim 24, wherein said trench fill material further includes a conducting material that is insulated from said substrate material of said substrate layer by said insulating material lining.

26. A method of fabricating a semiconductor device within which parasitic capacitances are minimized, the method comprising:

forming a substrate layer of a substrate material characterized by a first resistivity;

forming at least one deep trench in a trench portion of said substrate layer such that said trench portion of said substrate layer also includes substrate material, and filling said at least one trench of said trench portion of said substrate layer with a trench fill material characterized by a second, effective, resistivity lower than said first resistivity;

forming a field layer on a surface of the substrata layer over said trench portion of said substrate layer; and forming a passive device on a surface of said field layer over said trench portion of said substrate layer having said at least one trench formed therein, wherein said step of forming at least one trench in said trench portion of said substrate layer includes forming a plurality of trenches that collectively define a grid pattern.

* * * * *

UNITED STATES PATENT AND TRADEMARK OFFICE
CERTIFICATE OF CORRECTION

PATENT NO.: 5,742,091
DATED: April 21, 1998
INVENTOR(S): Francois Hébert

It is certified that error appears in the above-identified patent and that said Letters Patent is hereby corrected as shown below:

In Col. 5, line 65, please delete "linings" and replace with --lining--.

In Col. 8, line 25, please delete "substrata" and replace with --substrate--.

Signed and Sealed this

Sixteenth Day of June, 1998

Attest:

BRUCE LEHMAN

Attesting Officer          Commissioner of Patents and Trademarks